US011233355B2

(12) United States Patent
Sitbon et al.

(10) Patent No.: US 11,233,355 B2
(45) Date of Patent: Jan. 25, 2022

(54) DEVICE COMPRISING A SUPPORT FOR ACCESSORIES CONNECTED BY MAGNETIZED ATTACHMENTS

(71) Applicants: Eric Sitbon, Paris (FR); Ruben Sitbon, Paris (FR)

(72) Inventors: Eric Sitbon, Paris (FR); Ruben Sitbon, Paris (FR)

( * ) Notice: Subject to any disclaimer, the term of this patent is extended or adjusted under 35 U.S.C. 154(b) by 380 days.

(21) Appl. No.: 16/120,918

(22) Filed: Sep. 4, 2018

(65) Prior Publication Data

US 2019/0372268 A1 Dec. 5, 2019

(30) Foreign Application Priority Data

May 31, 2018 (FR) ...................................... 1854739

(51) Int. Cl.
*A41D 13/00* (2006.01)
*H01R 13/62* (2006.01)
*A41D 1/00* (2018.01)
*A41D 27/20* (2006.01)
*A42B 3/30* (2006.01)
*A45F 3/04* (2006.01)
*H01F 7/02* (2006.01)
(Continued)

(52) U.S. Cl.
CPC ......... *H01R 13/6205* (2013.01); *A41D 1/005* (2013.01); *A41D 27/20* (2013.01); *A42B 3/30* (2013.01); *A45F 3/04* (2013.01); *H01F 7/02* (2013.01); *H01F 7/06* (2013.01); *H05K 5/0086* (2013.01); *H05K 5/0217* (2013.01); *H05K 5/03* (2013.01); *A41D 2400/48* (2013.01)

(58) Field of Classification Search
CPC .......... A41D 1/005; A41D 17/00; A42B 3/30; H01R 13/6205; H01F 7/02; H01F 7/06
See application file for complete search history.

(56) References Cited

U.S. PATENT DOCUMENTS 3,810,258 A * 5/1974 Mathauser ......... H01R 13/6205
439/39
4,211,456 A * 7/1980 Sears .................. H01R 13/6205
439/39
(Continued)

FOREIGN PATENT DOCUMENTS

FR 2938383 A1 5/2010
WO 2016/122405 A1 8/2016

*Primary Examiner* — Richale L Quinn
(74) *Attorney, Agent, or Firm* — Banner & Witcoff, Ltd.

(57) ABSTRACT

A device and assembly comprising such device having a support for electronic connection, holding in contact, and attachment of at least two accessories to each other and/or to an external device, and said at least two accessories.

To make said connection, the support is provided with at least two first magnetic electronic connection elements. Each other by wire and each accessory is fitted with a second magnetic connection element capable of cooperating with one of said first magnetic elements, and in that each of the first and second magnetic elements comprises at least two groups each comprising at least one magnet, namely a group of one or more positive magnets and a group of one or more negative magnets, the groups of one particular magnetic element being fixed directly or indirectly on the same flexible or rigid plate and/or to each other and being capable of cooperating with the other magnetic element.

19 Claims, 10 Drawing Sheets

(51) Int. Cl.
   *H01F 7/06* (2006.01)
   *H05K 5/00* (2006.01)
   *H05K 5/02* (2006.01)
   *H05K 5/03* (2006.01)

(56) References Cited

U.S. PATENT DOCUMENTS

| | | | | |
|---|---|---|---|---|
| 4,544,903 | A * | 10/1985 | Grant | H01H 36/0073 335/205 |
| 4,653,503 | A * | 3/1987 | Heath | A61B 5/274 600/391 |
| 5,476,386 | A * | 12/1995 | Booth | H01H 9/0207 439/40 |
| 5,871,438 | A * | 2/1999 | Ardizzone | A61N 2/06 600/9 |
| 6,267,720 | B1 * | 7/2001 | Knox | A42B 1/008 600/15 |
| 6,561,815 | B1 * | 5/2003 | Schmidt | H01R 13/6205 439/38 |
| 7,637,747 | B2 * | 12/2009 | Jaatinen | A61B 5/25 439/39 |
| 9,391,394 | B2 * | 7/2016 | Kockx | H01R 13/03 |
| 9,611,881 | B2 * | 4/2017 | Khodapanah | F16M 11/041 |
| 9,858,368 | B2 * | 1/2018 | Buck | G06F 30/367 |
| 9,893,438 | B1 * | 2/2018 | Oster | A44B 17/0041 |
| 9,954,309 | B2 * | 4/2018 | Eid | H01R 13/631 |
| 9,955,049 | B2 * | 4/2018 | Pritz | A42B 3/227 |
| 10,039,186 | B2 * | 7/2018 | Baxi | H05K 1/112 |
| 10,702,001 | B2 * | 7/2020 | Morgan | H01F 7/021 |
| 2007/0285231 | A1 * | 12/2007 | Leftly | A45C 13/24 340/540 |
| 2010/0122832 | A1 * | 5/2010 | Bukshpun | A41D 1/005 174/11 OR |
| 2012/0256715 | A1 * | 10/2012 | Fullerton | H01F 7/04 335/285 |
| 2014/0215693 | A1 * | 8/2014 | O'Gara | A42B 3/069 2/410 |
| 2014/0259308 | A1 * | 9/2014 | Moss | A42B 3/0406 2/410 |
| 2015/0303619 | A1 * | 10/2015 | Kockx | H01R 13/6205 607/149 |
| 2016/0073723 | A1 * | 3/2016 | Halldin | A42B 3/06 2/411 |
| 2018/0026393 | A1 * | 1/2018 | Eid | H01R 13/6205 439/39 |
| 2019/0372268 | A1 * | 12/2019 | Sitbon | A41D 1/005 |

* cited by examiner

| Wire color | Number | Magnets | | Number | Wire color |
|---|---|---|---|---|---|
| Red | 1 | A | B | 6 | White |
| Black | 2 | C | D | 5 | Green |
| Ground | 3 | E | F | 4 | Ground |
| Ground | 4 | G | H | 3 | Ground |
| Green | 5 | I | J | 2 | Black |
| White | 6 | K | L | 1 | Red |

DEVICE COMPRISING A SUPPORT FOR ACCESSORIES CONNECTED BY MAGNETIZED ATTACHMENTS

This invention relates to a device comprising a support for maintaining contact, attachment, adjustment and electronic communication of accessories between each other and/or with an external device, said support and each accessory being provided with at least one magnetic electronic connection element capable of cooperating with a corresponding facing magnetic connection element.

It also relates to support assemblies and corresponding accessories.

It also relates to a method for using such a device.

It has a particularly important but non-exclusive application in the field of communication between electronic modules, objects, collars, bracelets, watches, sports instruments or any other equipment using magnetic elements for connection, particularly on helmets, kits, rucksacks, suitcases, hoods, etc.

An originality of this device is based on electrical conductions between modules, this conduction having to be as fine as possible in order to not impede the user.

For this, two means are used, in particular: an adhesive, copper strip and/or a conductive alloy enabling a high-quality conduction.

Magnetic or ferromagnetic objects can be divided into two categories: soft materials that are easily magnetized (high permeability and reversibility), and hard materials because they have strong remanent magnetization, that are used as permanent magnets.

Throughout the remainder of this description, we will use the term magnetic object to indifferently designate soft materials or hard materials that therefore form permanent magnets.

Note that a permanent magnet can equally well be a natural magnet or an artificial magnet. Therefore in this case, it can have a very variable constitution.

It can also be easily conformed and adapted to required uses so that it can accept much more intense magnetization with good stability, and more durably than natural magnets.

We will then also mention polarities or poles of the magnet(s) making up the magnetic objects used.

All magnets have two opposite portions called poles, namely a positive pole or north pole (tendency to move towards the north) and an opposite negative pole or south pole. Due to its layout, the magnet(s) of a magnetic element of one part is (are) designed to cooperate with the magnet(s) of the magnetic element of the other part, through one of its facing portions. To simplify matters, in the following we will use the term positive magnet to refer to the magnet for which the portion arranged to cooperate with the other port presents the positive pole, and the term negative magnet to denote the magnet that presents the negative pole.

Devices are already known to bring parts of clothes such as dresses, or accessories for example clothing accessories, shoes or belts) into contact, and to adjust and/or fix them to each other.

Holding in contact, fitting, adjustment or closing of an item of clothing, a shoe or any other accessory is thus traditionally done using buttons-button holes, cufflinks, press studs, closers laces, eyelets, zip fastener or by attachment means known under the trade name "Velcro®".

Such devices, some of which have been known since antiquity, have removable attachment means comprising male means and female means that can be connected to each other and that have disadvantages.

These means are not easily adjustable and cannot make an electrical connection for instantaneous communication and/or transmission of information.

They can also be noisy when connecting and disconnecting them.

Furthermore, their adjustment always requires a precise manual adjustment by the user, although this is difficult in some cases, for example in a risk and/or dangerous situation.

The use of magnets to connect two parts to each other is also known and can overcome some of these disadvantages.

But in general, systems according to prior art using magnets can only be used to associate two parts in a predetermined position of male and female elements, without any possibility of modifying the relative position of these elements, nor making an electrical connection.

Furthermore, the magnetic elements that can be metallic, can in some cases have an uncomfortable weight and/or risk generating a magnetic field that can be harmful to health.

It can be understood that the weight of a headset can be uncomfortable and/or an excessively strong magnetic field can have disadvantages, for example creating a risk of deregulating electronic devices placed nearby, for example a Pacemaker or a GPS system or a compass.

Electronic connections systems involving plugging a male connector into a female connector are also known.

Aid systems and systems to hold two surface connectors together making use of weak magnetization are also known, such as on computers of the type known as Mac Pro made by the American Apple company. In this case, this is an electrical power supply for which the connection is easily detachable.

This invention aims to overcome these disadvantages by disclosing a device for attachment and adjustment of accessory parts to each other, providing a better solution than those known in prior art, particularly in that it optimizes the weight and the strength of the magnets used, particularly due to ultra-powerful magnets composed of magnets placed with alternating north/south polarity, in that it is easier to put into place while allowing a better attachment, more comfortable for the user and a reliable and repetitive electronic connection.

Use and also maintenance (for example washing) are also facilitated.

In order to achieve this, this invention in particular discloses a device comprising a support for electronic connection, holding in contact, attachment of at least two accessories to each other and/or to an external device, and said at least two accessories, characterized in that to make said connection, the support is provided with at least two first magnetic electronic connection elements connected to each other by wire and each accessory is fitted with a second magnetic connection element capable of cooperating with one of said first magnetic elements, and in that each of the first and second magnetic elements comprises at least two groups (or blocks) each comprising at least one magnet, namely a group of one or more positive magnets and a group of one or more negative magnets, the groups of one particular magnetic element being fixed directly or indirectly on the same plate and/or to each other and being capable of cooperating with the other magnetic element.

Advantageously, the magnetic field is more than 1500 Gauss.

Advantageously again, at least one part of the first magnetic elements or each first magnetic element and/or at least one part of the second magnetic elements, is associated with an anti-magnetic protection element.

The magnetic field is (for example, 3500 Gauss with a neodymium 52 type magnet, or 2000 Gauss with N40 for a magnet of size 6×4×1.5 mm).

The electrical connection by magnetic then wire connection between modules enables a transmission of very fine information.

Advantageously, and to achieve this, two means are particularly used, but non-limitingly, namely an adhesive, copper tape (for example, a Scotch® Copper tape) and/or a conductive alloy or composite material, optimized at the level of its conductivity, for example greater than $10^5 \times S.m^{-1}$, for example between $10^5$ and $5 \times 10^6$ $S.m^{-1}$, advantageously between $10^6$ and $5 \times 10^6$, for example between 3 and $4 \times 10^6$ $S.m^{-1}$.

Also advantageously, a combination of the means above can be used, and in particular, a combination between a copper wire (for example, 0.2 mm thick) covered with an alloy layer such as described, and/or adhesive, conductive strip (for example, Scotch® Copper tape, of thickness between 0.04 and 0.08 mm) and alloy layer and/or Scotch® Copper double-sided tape+sheet of aluminum paper (thickness, for example, of 0.3 mm)+alloy layer.

Each module will comprise at least one electronic component and/or device having one and/or more specific functionalities (GPS, accelerometer, HF transmitter/receiver, etc.).

"Anti-magnetic and/or magnetic protection means" refers to a plate, a film or a case forming a screen arranged to sufficiently block magnetic radiation, preventing it from reaching the space on the side of the screen opposite the magnets.

To achieve this and more precisely, each first magnetic element is fixed to the support for example non-removably and/or each second magnetic element comprises on the side of its attachment to the support and/or on the side of the electronic component of the module to be connected, a magnetic insulating screen. This insulating screen composed in a manner known in itself, protects elements located on the other side of the support from magnetic radiation, as described above.

Advantageously, the support comprises a first impermeable fabric sheet, the device also comprising at least one second impermeable fabric sheet covering the first magnetic elements and through which passage holes are formed facing the first magnetic electronic connection elements.

In one advantageous embodiment, the holes are filled with an impermeable conducting glue ensuring sealing.

Also advantageously, the magnetic elements are firstly covered with a strip of sticky and possibly sanded copper.

Advantageously, the external surface of the conducting glue is covered with a Teflon layer before the glue has finally dried, for example and is then perforated to give better electrical conduction.

The conducting glue may for example be obtained by mixing epoxy resin with a hardener into which a fine powder of graphite and silver paste have been added.

Advantageously, the proportion of fine graphite powder is between 15% and 40% by weight of the total mixture, for example 25%, and the silver paste is between 0% and 10% by weight of the total mixture, for example 5%.

For example, a composition comprising 3 g of fine graphite powder (granulometer≤1μ), 5 g of copper powder (granulometer≤1μ) and 1.6 ml of flexible epoxy resin of known type can be used. To this, the surface treatment of this alloy must be added, which must be sanded then polished, for example by sanding with a blade tilted at 45°, then buffing.

In some advantageous embodiments, either or both of the following measures are also adopted:
the magnetic protection element is metallic and is between 0.1 mm and 2 mm thick, advantageously between 0.2 mm and 1.5 mm, for example equal to 0.5 mm.

For example, it may be a thin iron plate (less than 2 mm thick) or advantageously a steel plate forming an excellent magnetic mirror with a thickness chosen by an expert in the subject to obtain the required mirror/barrier effect.

It is observed that there is an increase in the strength of the magnetic field of the magnet and/or of the magnetic element on the side opposite said protection element (mirror effect) depending on the configuration and the thickness.

For example, the strength of the magnetic field can be increased by 20% using a 0.2 mm thick iron film;

For example, the thickness can be obtained by choosing a single steel plate, for example 1.2 to 1.5 mm thick, or by using several layers of steel foil that are added together to make the thickness necessary to reflect the magnetic field onto the opposite face. The use of the multilayer steel strip technique enables to obtain a great mechanical flexibility of the mirror, that would not enable a steel plate thicker than 1.5 mm, for example.

It must also be noted, that the protective element is longer and wider than the group of magnets (for example, ⅓ larger on each side) to best be interposed with magnetic field lines. The magnetic mirror comprises, for example, between 3 and 8 fine layers (for example 4) of steel strip (thickness 0.10 to 0.20 mm) opposite the neodymium magnet.

The fine layers can curl over the sides in one direction (opposite the magnet) or in the other (towards the magnet) to best trap the magnetic field lines and enable the strips to exert their protective role.

An optimum thickness is thus observed corresponding to the thickness of the magnet used, therefore 1.2 to 1.5 mm of steel for a 1.5 mm thick magnet. But a single 0.2 mm layer of steel foil is sufficient to block 80% of the magnetic field of the magnets and therefore to provide sufficient protection for the electronics contained in the electronic modules that are concerned and/or associated.
the first and second magnetic elements correspond to groups of magnets, the groups of first elements being capable of cooperating with groups of corresponding second elements with the opposite sign;
the magnets in a particular first or second magnetic element are rigidly and non-removably fixed and are electrically insulated from each other;
each first and second magnetic element comprises at least two magnets per group, the positive magnets of one element being placed in alternation with the negative magnets of the same element;
the magnets of a particular element are fixed side by side on a plate directly or are separated by a wall.

Advantageously, they are articulated, in other words, that the plate is flexible, and that they can therefore be adapted to a certain curve, for example corresponding to that of a cranium;
the field of the first and second magnetic elements is greater than or equal to 2000 Gauss, advantageously greater than or equal to 3500 Gauss;
each first and each second magnetic element comprises at least one row of magnets inserted in an elastic glue layer resistant to household washing, itself fixed to the flexible or rigid support;

one or several magnets in each first and second magnetic element has (have) a rectangular or circular cross-section;

the magnets are derived from the family of rare earths and are of the neodymium iron boron type;

each first and second magnetic element is partly or wholly protected by galvanizing with nickel and/or gold and/or epoxy;

the wire connection between the magnet and/or magnetic elements is integrated between two fabric sheets, one of which forms the support;

the wire connection and the support are stretchable. Stretchable means the ability to stretch between a first compact position and a second position elongated by a few centimeters, for example 1 to 5 cm, for example 3 cm, from the first position. This can be achieved by making the wire connection in the form for example of an accordion or a corkscrew;

each accessory comprises a removable housing containing a second magnetic element arranged to correspond to a first magnetic element facing it, to be gripped manually by a user;

at least one accessory housing comprises complementary mechanical clipping means arranged to enable the adjustment/clip fitting of said housing on a complementary shaped part fixed to the first magnetic element.

The invention also discloses a headset, clothes or accessories particularly comprising devices representing one and/or the other of the characteristics described above.

It also relates to a headset and/or clothing assembly comprising at least one device worn by a user and wire connection means through an accessory between said headset or clothing and the portable device.

The device may for example be a rucksack, or a jacket with a pocket or removable pocket.

If the pocket of the charger is empty, information is transmitted via the pocket/rucksack connection, then rucksack/headset, then transmission module headset, then to the staff who can automatically send one or more new chargers, for example with a drone to the soldier in difficulty as they have no ammunition.

The pocket can be of any type (pocket for ammunition, grenade, cartridges, map, first-aid kit, water bottle, gas mask, food, etc).

The concept of delivery by drone, combined with a device of this type is itself completely new. The delivery can be triggered automatically using an order from the pocket, the headset, a specific module, another drone or the drone itself, or manually by a third party who can device to resupply or not.

The lives of a lot of soldiers will thus be able to be saved with this system.

Advantageously, the portable device is a jacket fitted with a fabric comprising a sheet of connected wires forming a damaged zone detection matrix.

In another advantageous embodiment, the invention proposes an assembly which comprises one, several or all of the following elements:

a. a headset, one or more clothes (for example a jacket), a rucksack, one or more connected pockets, and possibly other connectable accessories;

b. one or a plurality of modules comprising one or more electronic circuits or device having one or more specific functionalities, and such as described above and a battery (advantageously situated behind the headset);

c. a fabric (hood) that is slidable over the headset, advantageously formed from a pattern cut-out in only three parts, without clamps (the prior art provides more than three parts with clamps in the material, in order to support the rounded shapes of the headset) and comprising the first magnetic elements (as described above) and their wire connection.

The modules comprise magnet blocks advantageously articulated, with crossed contacts and are connected to one another through the wire connection forming an electronic circuit on the reverse of the fabric, formed by adhesive, copper, aluminum or other conductive metal tape strips and/or by strips formed by a conductive alloy deposit, for example deposited by screen printing (on the reverse of the fabric of the hood).

Advantageously, the wire connections are formed by a combination of a conductive, adhesive tape strip covered, at least in part and/or at least by placing, by a conductive alloy deposit of the type described above or below.

Also advantageously, said device comprises a pocket, for example a charger or any other type of connected pocket, arranged to automatically request (or not) a replenishment of its content.

In an advantageous embodiment, the portable device is a jacket equipped with a fabric for detecting an impact.

To achieve this, it comprises, for example, a sheet of connected wires forming a matrix for detecting a damaged zone.

Advantageously, this detection generates the sending of a request for medical aid and/or a medical care kit in operation.

Advantageously, the wire connection is made according to one of the following embodiments:

Alloy (resin+graphite/copper) only;

Adhesive tape of the Scotch® Copper type or aluminum, only;

A combination of both over at least one part of the wire connections, i.e. conductive, adhesive tape covered with a thin alloy layer (for example, less than one or two hundred microns, less than several microns, for example less than 1 micron).

The invention also proposes a method for using a device and/or a system such as described above.

The invention will be better understood after reading the following description of embodiments given as non-limitative examples. The description refers to the accompanying drawings among which:

Figure 3:
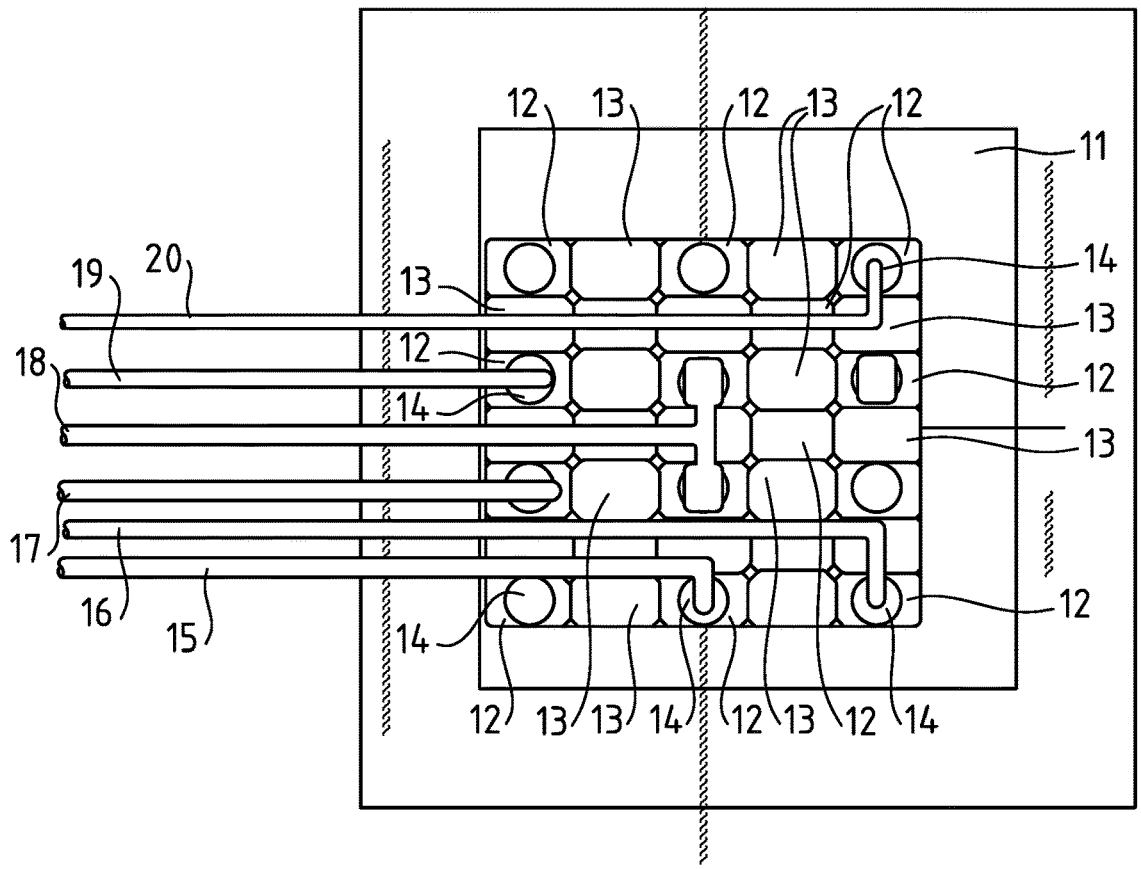
FIG. 3 is an enlarged view of one embodiment of a first magnetic element comprising six electrical connection outputs.
Figures 3A, 4:
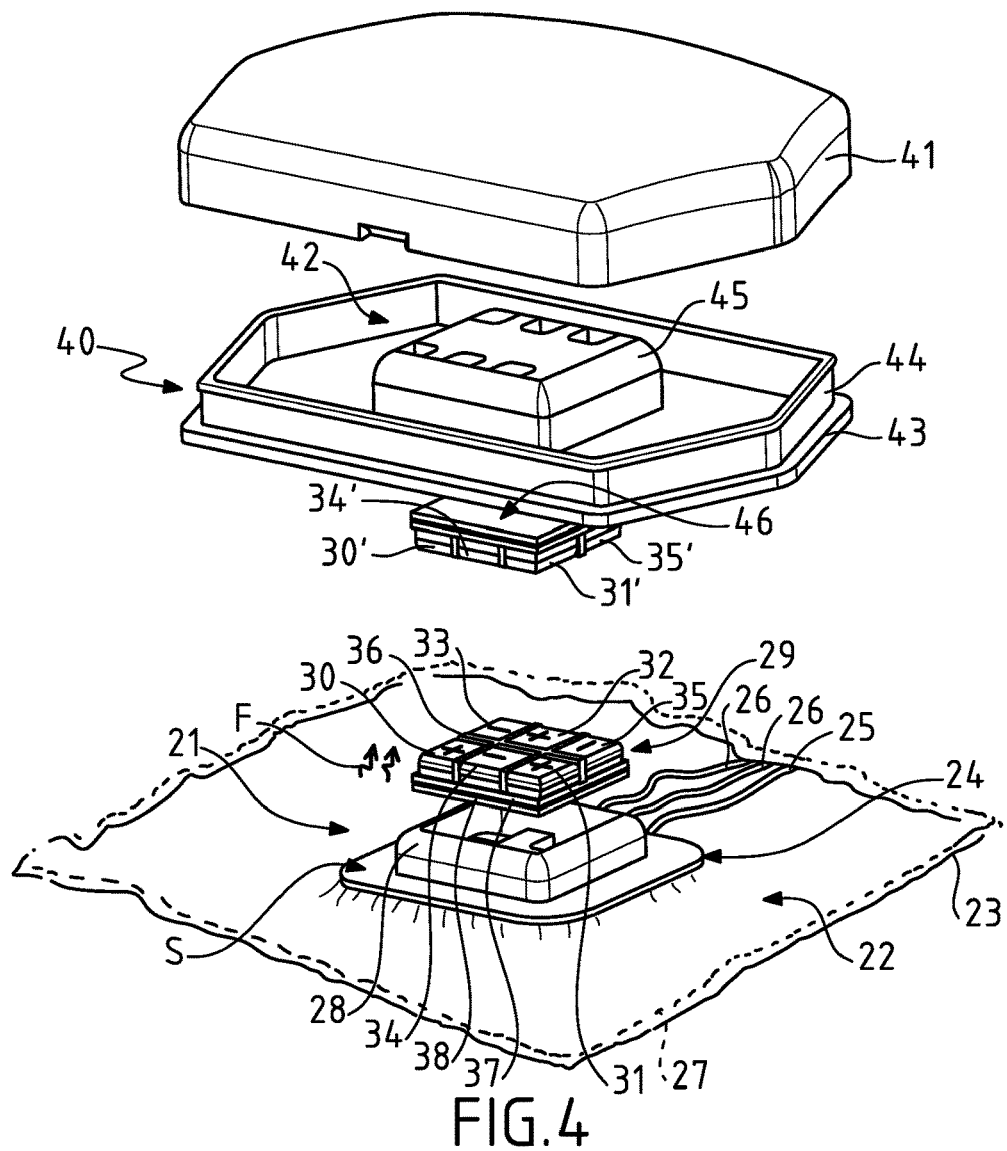
Figure 5:
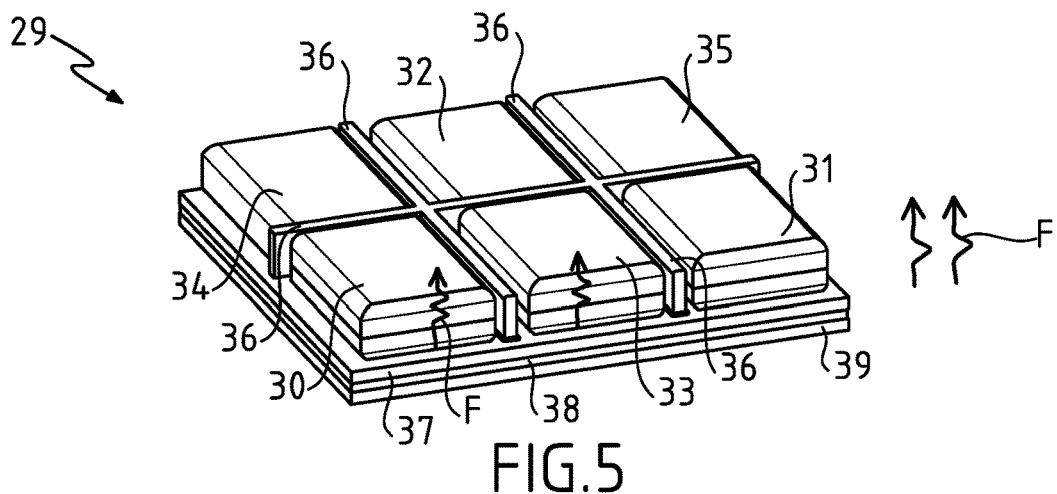
Figure 5A:
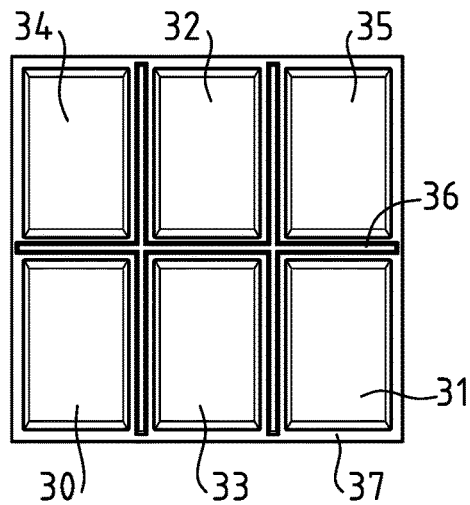
Figure 5B:
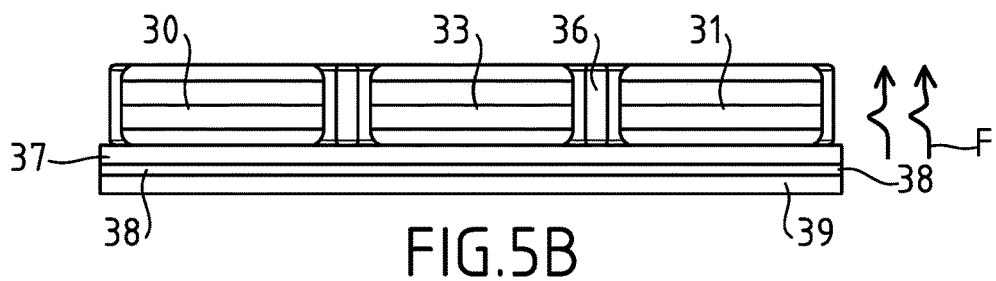
Figure 5C:
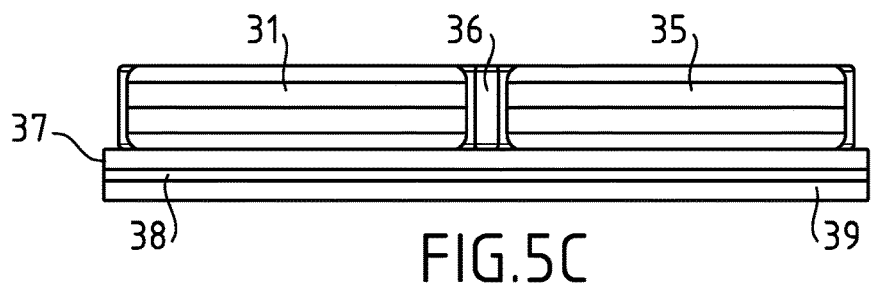

FIG. 3A gives an example of a wiring distribution scheme for a first magnetic element of the USB type connector.

FIG. 4 is an exploded perspective view of an accessory and the associated first magnetic element according to one embodiment of the invention.

FIGS. 5, 5A, 5B and 5C are perspective, top, longitudinal lateral and cross-sectional lateral views respectively of a group or block of magnets belonging to a first or second magnetic element according to the embodiment in FIG. 4.

Figure 6:
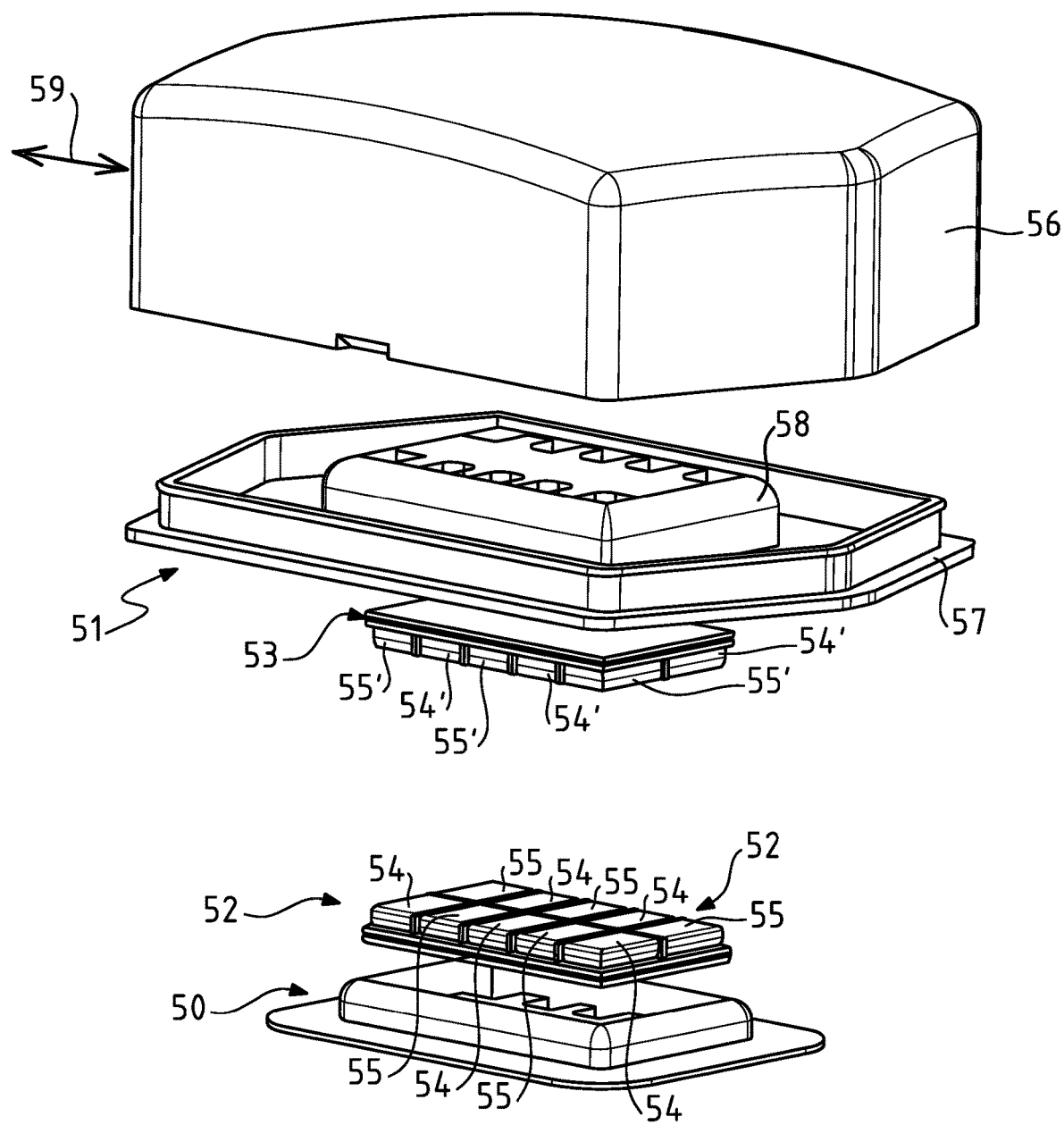

FIG. 6 is an exploded perspective view of an accessory and the associated first magnetic element according to another embodiment of the invention.

Figure 7:
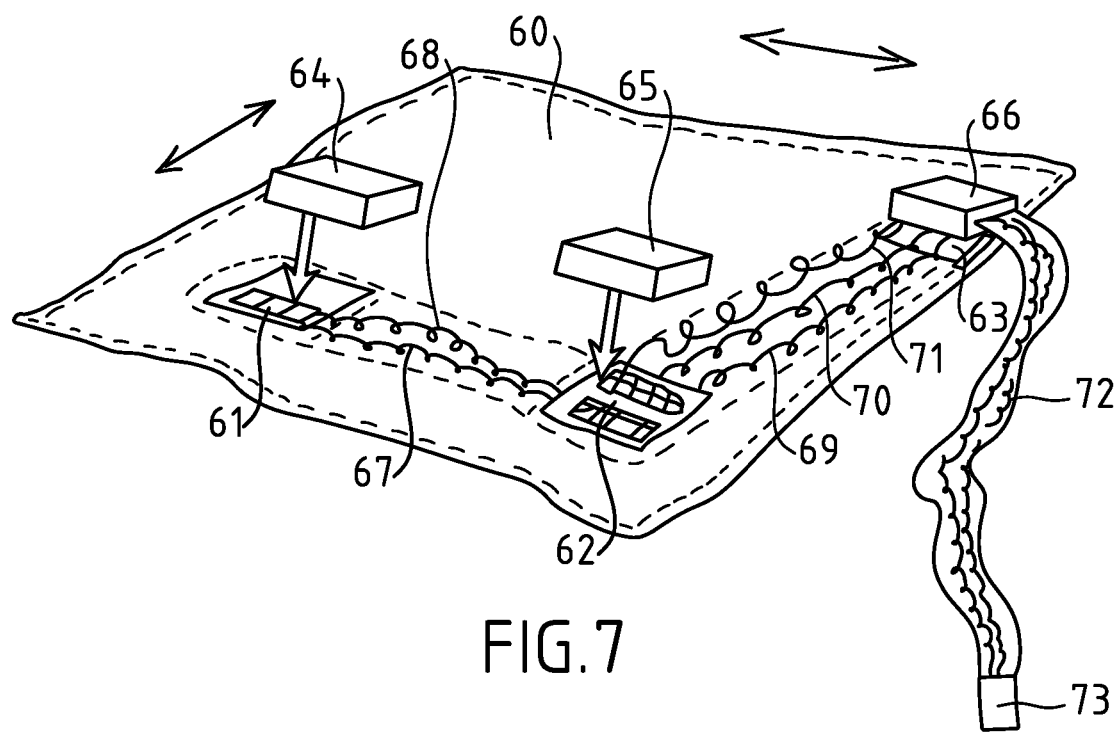

FIG. 7 is a diagrammatic perspective view of an elastic support fabric associated with first and second magnetic elements connected to each other by stretchable wires providing elasticity, according to another embodiment of the invention.

Figure 8:
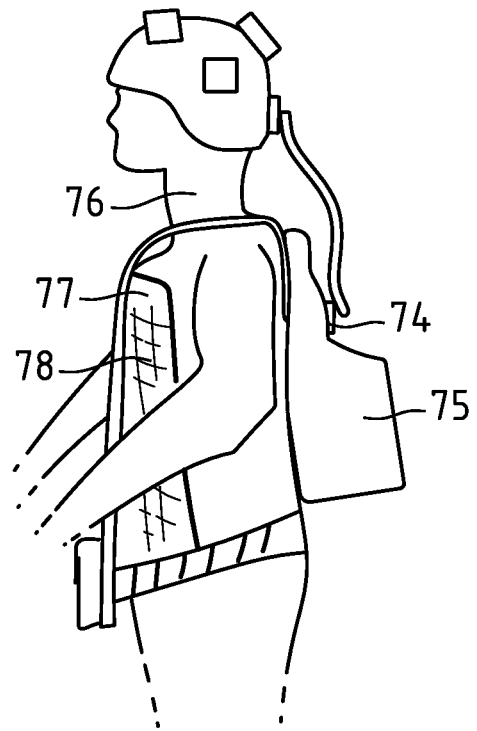

FIG. 8 is a lateral view of a device worn by a user that can be externally connected to the support (in this case a headset with a rucksack), according to another embodiment of the invention.

Figure 8A:
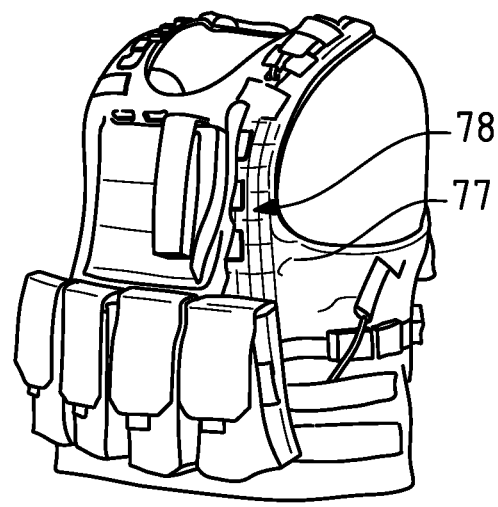

FIG. 8A shows a jacket that can be connected to the headset in FIG. 8.

Figure 9:
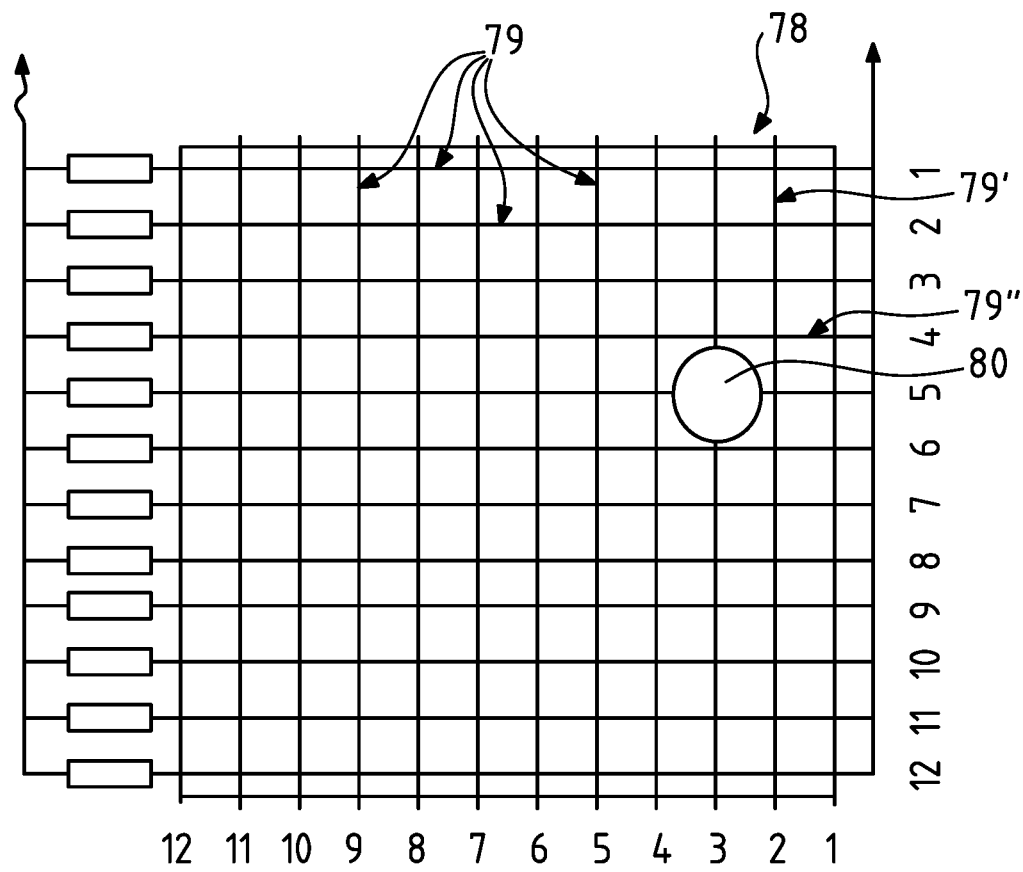

FIG. 9 diagrammatically shows an example of means of detecting a shock and/or hole formed in the fabric on the jacket in FIG. 8, that can be connected to the device according to the invention.

Figure 10:
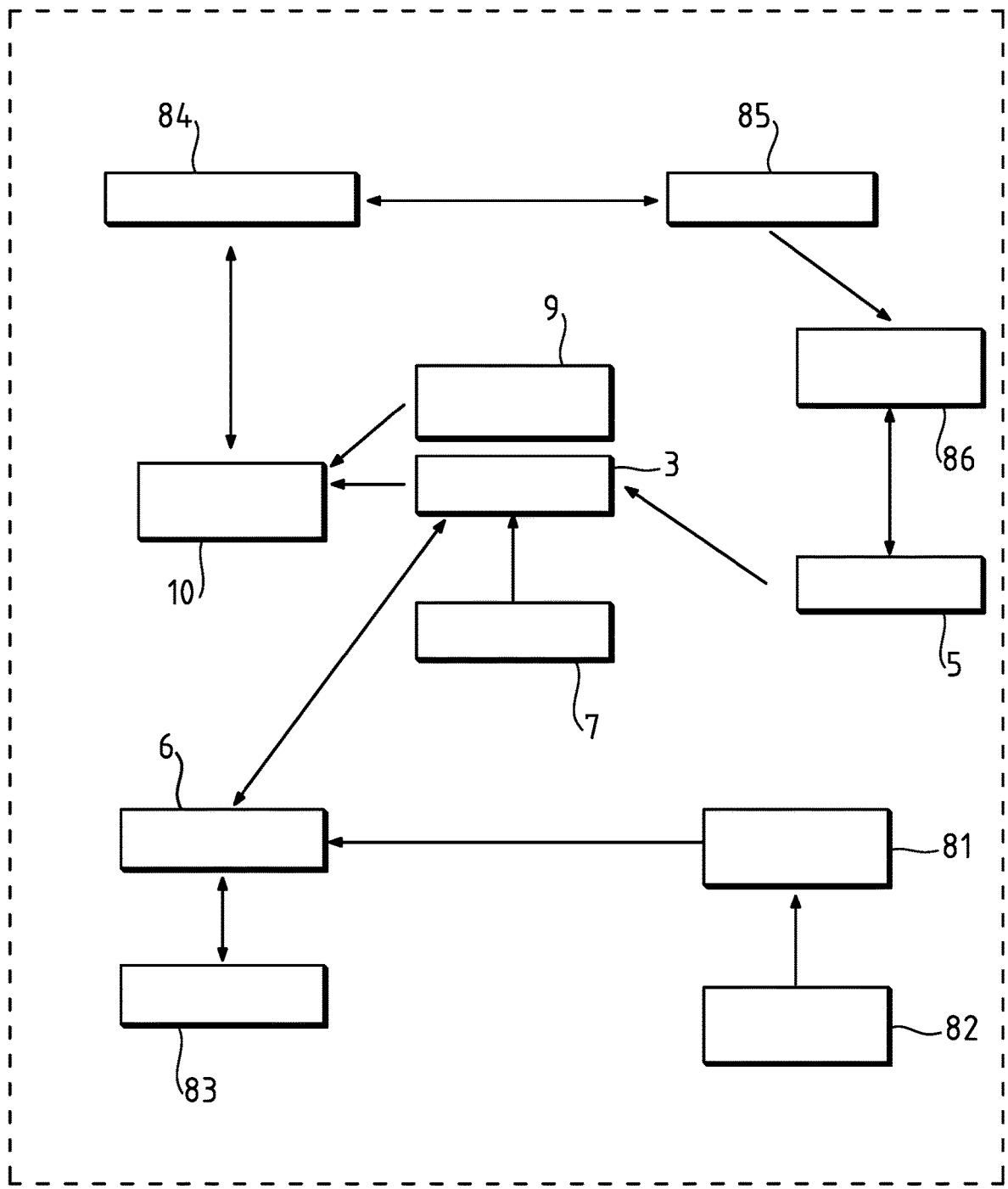

FIG. 10 is an explanatory diagram showing the connection of a device according to the embodiment described particularly herein.

This diagram also shows a method for using such a device.

Figure 11:
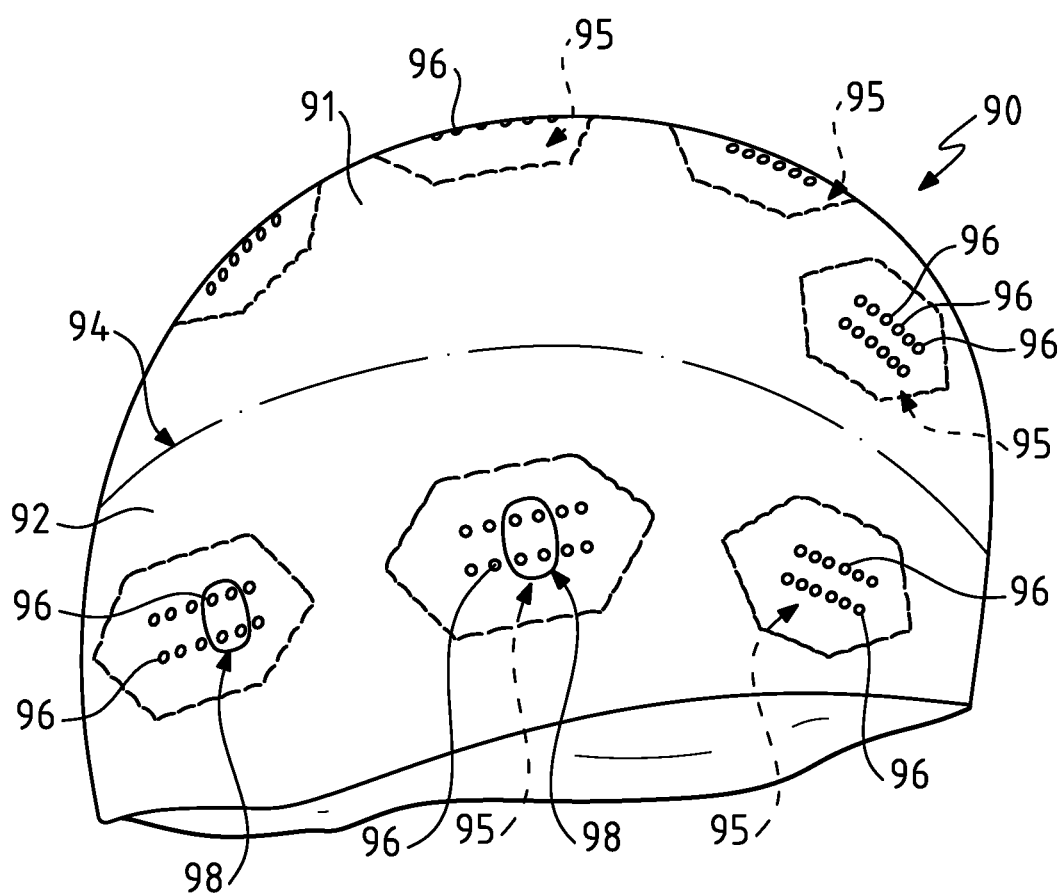

FIG. 11 is a perspective view of a fabric hood forming a support for a device according to one embodiment of the invention.

Figure 12:
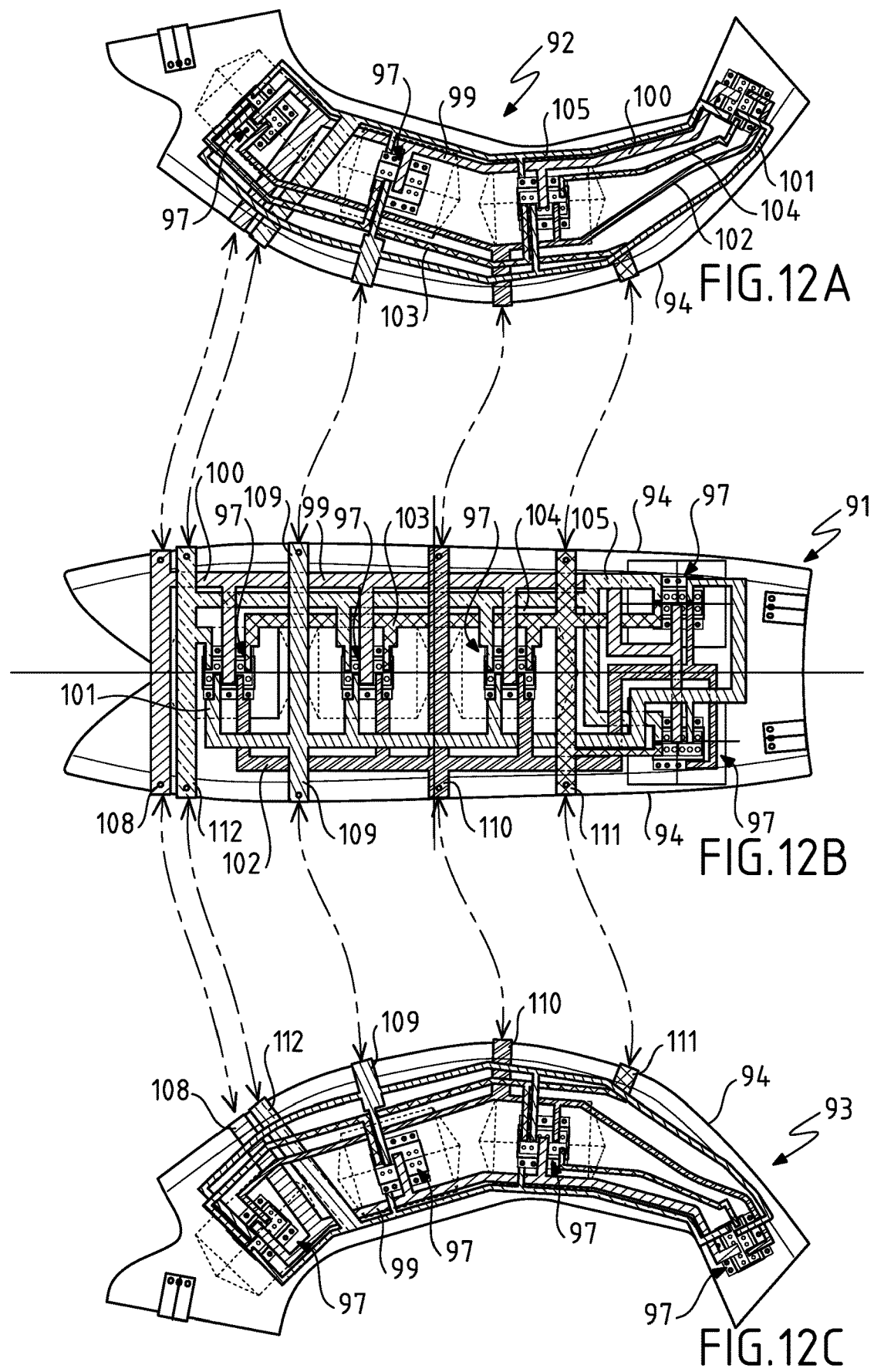

FIGS. 12A and 12B and 12C are top views of three fabric patterns comprising first magnetic elements and their electrical connections for fabrication of the hood in FIG. 11 simply according to an embodiment of the invention.

Figure 13:
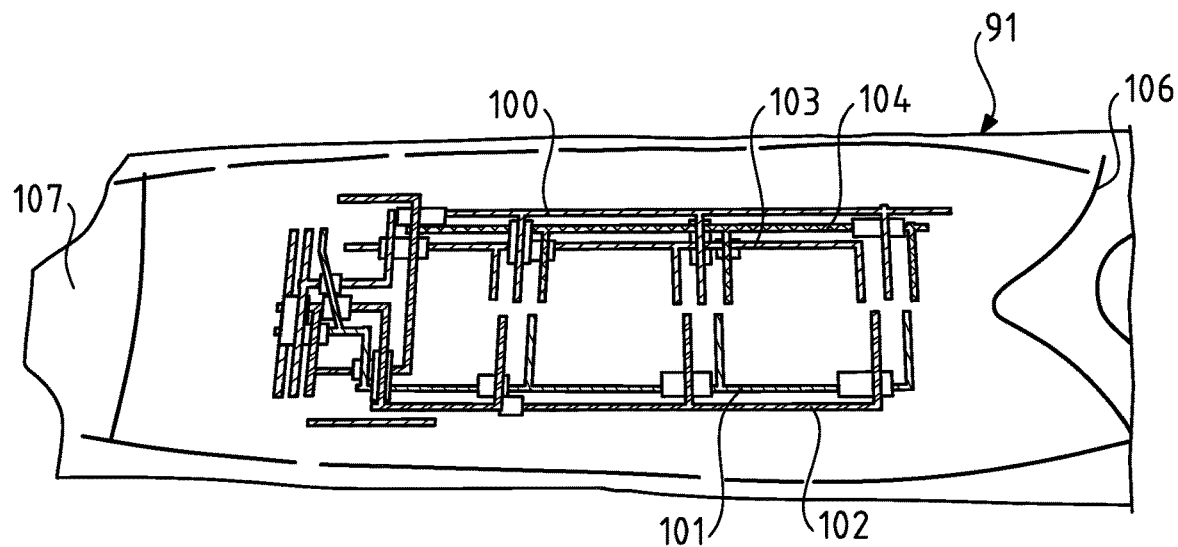

FIG. 13 is an example of a central pattern for the hood according to an embodiment of the invention with screen printing electrical connector system, for example obtained by stencils.

Figure 14:
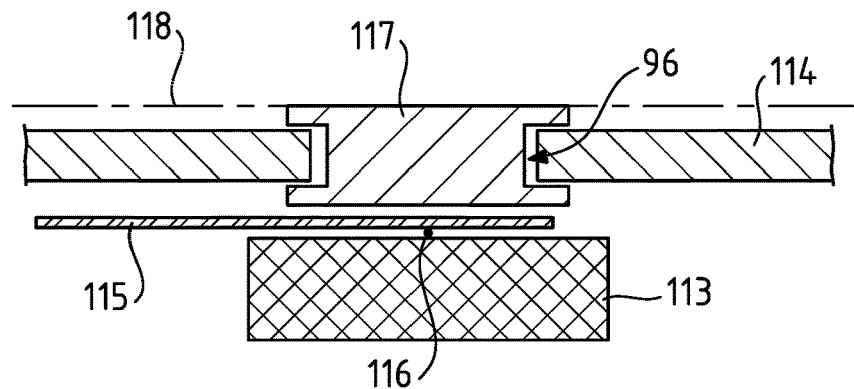
Figure 15:
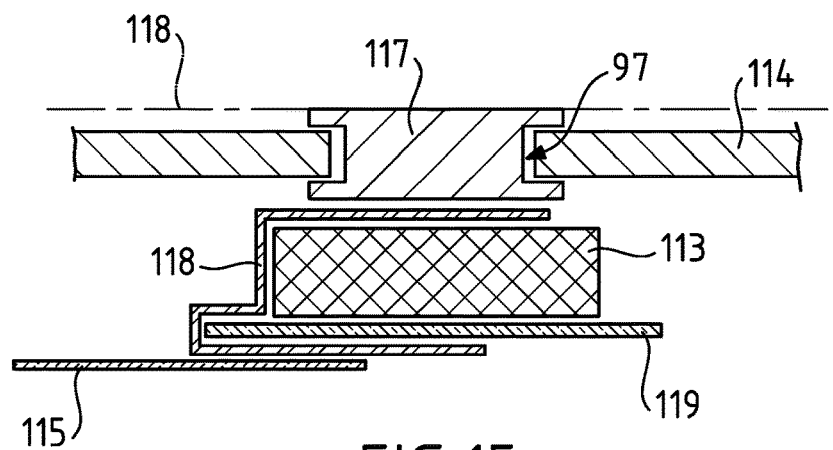

FIGS. 14 and 15 are sectional views diagrammatically showing two example embodiments of the external contact part of a magnetic element forming part of a device according to two embodiments of the invention, at the hole in the upper fabric.

The same reference numbers will be used whenever possible to designate the same or similar elements, throughout the remainder of the description.

The magnets used in embodiments of the invention described specifically herein are preferably based on neodymium, iron boron with a compressed density of 7.3 to 7.5 g/cm3, the coating of the magnet making it conductive, possibly being obtained from an alloy based on nickel, zinc or tin, and/or copper.

One example of an advantageous method for making the magnetic materials based on rare earths for use with the invention is also and for example as follows.

The different raw materials for the alloy are firstly mixed with high precision, under a vacuum or inert gas.

For example, components are mixed according to the following preparations by mass of neodymium iron boron with 25% to 31% of neodymium, 2 to 3% of a mixture of Cu, Al, Co, Ga, Nb and Zz, 0.8% to 1.1% of boron (Neodymium 38 to 52) and the remainder being iron or neodymium 40 in one preferred embodiment composed of the order of 28.8% of neodymium, 1% of boron, 4% of Ce, Al, Cu, Co+others and the remainder iron.

The basic material can be obtained by melting constituents or by calcio thermal reduction, for example at about 1300° C. from an NdFe fluoride and iron chloride FeCl3 compound (NdF3+Ca+FeCl3−<(NdFe)+CaClF+CaFe2).

The raw material particles are ground until they satisfy very precise tolerances (grains of the order of 1 micron).

The products are then stamped, imposing a powerful magnetic field on them to orient the metallic particles.

Finally, the elements are sintered in special vacuum furnaces at 1050° C., or under argon.

After fast cooling, the temperature is brought back to high temperatures (600 to 900° C.) before fast quenching to terminate the cycle.

Finishings are then made using spark erosion machines or machines fitted with diamond tools because the final product is very hard.

Materials that can be used include particularly Samarium Cobalt (SmCo5, SmCo17) and other types of neodymium iron boron (Nd2F14B), that are very efficient magnetic materials based on rare earths.

The final product made of neodymium iron boron can be made conducting while preventing the oxidation process for example by galvanizing it simply (Ni, Sn or Zn) or triply (Ni+Cu+Ni) (Sn+Cu+Sn) or (Zn+Cu+Zn) or advantageously Ni+Ni+Au or Ni+Au.

In the case of nickel, gold galvanization, thicknesses of nickel and gold equal to the order of 0.01 mm and 0.001 mm respectively can be used.

The magnets can advantageously be covered one by one with a protection layer, also obtained by nickel/copper or nickel/epoxy galvanization, or any other galvanization that will prevent rusting of the magnets.

These higher quality magnetic materials are used at locations at which a very high magnetic force is required and occupy only one fifth of the space occupied by hard ferrite magnets with the same magnetic power.

They are then cut to the required dimensions, for example 3×3×2 mm and fixed by gluing them to each other in configurations that will be described below with reference to the following figures.

Figure 1:
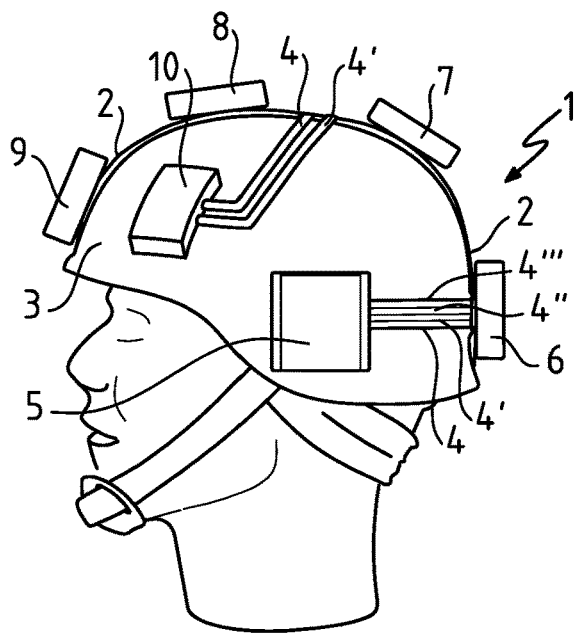
FIG. 1 is a lateral view of a headset fitted with a device according to a first embodiment of the invention.

FIG. 1 shows a device 1 comprising a support 2 in the form of a hood made of a stretch fabric woven removably onto a headset 3 and for example attached with hooks stitched onto the fabric.

Figure 2:
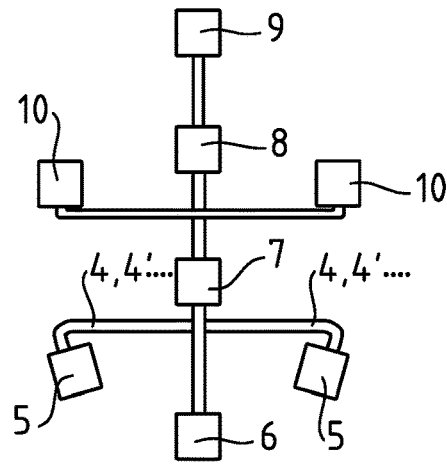
FIG. 2 is a diagrammatic top view of a set of first magnetic elements and a possible connection network between the elements, for example that can be used with the helmet in FIG. 1.

The support enables electrical connection 4, 4', 4" . . . , keeping them in contact and the attachment of several accessories 5, 6, 7, 8, 9 and 10 to each other (see also FIG. 2).

For example, accessory 7 is a rechargeable battery (connection 4) supplying power to accessories 5 (weather—pressure, humidity sensors, etc.), 6 (connector with a rucksack or a breast plate), 8 (GPS), 9 (visual-camera) and 10 (electromagnetic wave transmission module with an external server—not shown).

In the particular embodiment described herein, the connection between the base plates is made with copper or aluminum tape strips glued on the lower fabric, between two fabric layers one of which acts as a support.

The upper fabric is impermeable and protects the magnetic strips and the upper part of the first magnetic elements from dust and humidity, without preventing electromagnetic contacts between them, for example as explained in the embodiments described below with reference to FIGS. 11 to 14.

Advantageously, portions of insulating tape are provided at appropriate locations in order to prevent bad contacts between strips.

The location of accessories can be different and/or can be at specific positions.

For example, the battery can be located at the back of the headset, its weight then being chosen so as to compensate the weight of infrared goggles on the front of the headset.

But it would also be possible to use a module to house a standby battery (or secondary battery) or a battery to supply power to the modules continuously if the main battery behind the headset is replaced.

FIG. 2 shows an example of connections between the first magnetic elements, for example as shown on FIG. 3.

More precisely, FIG. 3 shows a first magnetic element comprising a support 11 on which magnets 12, 13 are fixed with alternating polarities, in other words a first polarity, for example positive, alternating with a second negative polarity, by gluing.

In this embodiment in which a six-wire electrical connection is required, in which one wire is connected to two nearby magnets, in particular a coating is provided for the magnet concerned (in this case part of the magnets 12) among these magnets, by a specifically conducting material (Nickel, Cu, etc.), the magnets being electrically insulated from each other in a manner known in itself to prevent short circuits, for example by a plastic film and/or a wall (see below).

The contact or solder of the wire onto the magnet, for the connection with another device, can for example be made by cold soldering and/or using a conducting glue.

The wire can also be a conducting strip in the form of a tongue (for example 1 or 2 mm wide) made of copper or aluminum placed on the side or face of the magnet (attachment tip 14), or with copper tape placed on the active face of the magnet.

FIG. 3A shows an example of a reversible connection for a USB type connector.

A USB connector comprises four wires (Red=5 volts (Vbus), White=data–, Green=data+, Black=ground) and a second ground=braid wound around the four wires, namely five contacts.

The five contacts are essential for transmission of images.

In this embodiment and in order to make the USB contact reversible, the positive magnets denoted A, C, E, F, G, I and K of a first magnetic element of a first accessory as described with reference to FIG. 3A, are then connected to the negative magnets B, D, F, H, J, L of a first magnetic element of a second accessory.

For example, the wires could thus be connected as follows:

Groups: Ground: EFGH, Red: AL, Black: CJ, Green: DI, White: BK.

FIG. 4 shows a portion of a device comprising another embodiment of the first magnetic elements 21 according to the invention.

This embodiment does not show the fabrics and/or protections of the external electrical contact parts between first magnetic elements and second magnetic elements (with their orifices enabling contact).

The device comprises for example a base S, for example rectangular and made of insulating plastic material, fixed on the support 22, for example a first sheet 23 made of impermeable stretch fabric known in itself, with glue made impermeable by silicone 24 around the bottom of the base.

The electrical wires 25 or small strips of sticky copper 26 are placed (fixed) on the first sheet 23, and are covered by a second sheet made of impermeable stretch fabric 27 (in dashed lines on FIG. 4) fixed on the first sheet in a manner known in itself.

In this embodiment, third and fourth impermeable sheets (therefore not shown) protect the external surfaces of the first and second magnetic elements sealed by silicone, and conducting glue on the pads themselves as described below.

The base plate S comprises a receptacle 28 arranged to contain a block 29 comprising six magnets in the form of parallelepiped shaped pellets (for example 3×3×2 mm), with alternating polarity, namely three positive magnets 30, 31, 32 and three negative magnets 33, 34 and 35 insulated from each other by walls 36 made for example from PLA.

Each magnet and/or magnetic element is inserted in a layer of elastic glue (not shown) resistant to washing, itself fixed to the support. They are all, or for some of them (according to the needs of the electrical connector), connected to the electrical wires 25 in a manner known in itself.

The walls 36 are sufficiently thick to prevent short circuits.

The magnets are fixed on a flexible or rigid horizontal rectangular plastic plate 37 and comprise a screen 38 (thin iron film) on their faces on the side of the support 22, that will enable a mirror effect (arrow F), for example the screen itself being fixed on a plastic sheet (for example PU) 39 to make the attachment to the base plate S.

They comprise a protection layer or fabric on their faces on the side opposite the support, providing protection against humidity and making the assembly impermeable to water and dust, however the conducting parts are free, for example in a manner known in itself and/or as described with reference to FIGS. 11 and 14.

The portion of a device on FIG. 4 also includes an accessory 40 comprising a box fitted with a removable lid 41 and a lower part 42, for example with a hexagonal shape, comprising a lower plate 43 fitted with an edge 44, arranged to hold an electronic device 45 (GPS, remote control system, movement sensor (accelerometer) etc.) connected as described above (by soldering and/or gluing with conducting glue) to the magnets in the block 46 of a second magnetic element, namely three positive magnets 33', 34', 35' arranged to cooperate with three negative magnets 33, 34, 35 of the first magnetic element, and three negative magnets 31', 32' and 33' arranged to cooperate with the three positive magnets 31, 32, 33 facing the magnets of the first magnetic element, but also in this case impermeable to external humidity.

The block 46 is also inserted in the lower face of the plate 43 and of the assembly 45 with which it is therefore connected as described above.

The external face of the block 46 is flush with the rest of the lower face.

Advantageously, the clip-fitting means (not shown), known to an expert in the subject, are provided between the plate 43 of the second magnetic element and the first magnetic element 21.

The first magnetic element of FIG. 4 is shown more precisely on FIGS. 5 and 5A to 5C.

FIG. 6 shows another assembly of the first and second magnetic elements (50 and 51).

In this case, the blocks 52, 53 are formed from five positive magnets 54, 54' and five negative magnets 55, 55' arranged alternately and offset facing each other between the two opposite elements.

A click-fitting lid of the housing 56 on the support 57 of the electronic device 58 is provided to enable a good manual grip of the accessory to fix-release the first magnetic element, particularly by a simple lateral action (arrow 59) to separate the magnets on the first and second magnetic elements. The polarities that attract each other then suddenly repel each other.

FIG. 7 shows a double stretch fabric 60 acting as a support for firstly the first magnetic elements and the connection strips or wires, and secondly impermeable protection of the same elements (but enabling electrical contacts between the two).

More precisely, three first magnetic elements 61, 62 and 63, are represented in this figure, arranged to cooperate with three accessories 64, 65, 66, the first elements 61 and 62 being connected to each other by corkscrew type wires 67, 68, etc. (not all represented) enabling elasticity, and the first elements 62 and 63 also connected to each other by wires 69, 70, 71 in the same manner.

The accessory 66 is connected through a strip 72, for example that may also be elastic and connected to a second magnetic element 73 and/or another type of connector such as a USB connector that will for example be connected to an external device 74 on the rucksack 75 (see FIGS. 8 and 8A) of the user 76.

The user 76 also wears a jacket 77 comprising a sheet 78 (see also FIG. 9) of connected wires 79, 79', 79" so as to identify a damaged zone 80 in a manner known in itself, for matricial electrical detection.

Cut wires 79 provide information about the matricial location by a change in the resistivity of the wires concerned.

More precisely, functioning of the fabric can detect an impact or a cut, for example based on the functional principal described below.

The fabric comprises a multitude of sets each formed from a wire and/or a line (for example conducting ink) and a given resistance value R, placed vertically and horizontally (diagonal wires could also be added).

A first set comprises a thin tinned (or twisted) copper wire 79 and a resistor, for example with a value of between 1 and 10000 Ohms.

A second set is identical except that in this case the value of the resistor is equal to 2 to 20000 Ohms.

The sets are permanently powered by a battery.

A relay is provided (not shown) with two positions: make and break is provided. The make position is powered by the battery, and the break position occurs if the wire is broken. Therefore, if the wire is cut, it provides information that the wire of the first, or second, etc. resistor is broken.

The vertical wires are ordinates and the horizontal wires are abscissas.

As shown on FIG. 9, the impact point 80 can be localized by vertical wire number 3 (79) and horizontal wire number 5 (79').

The information transmitted will be 3V/5H, therefore the person who receives the information will know the impact point 80 precisely and can deduce information from it.

One example use of a device according to the embodiment of the invention described specifically below is represented with reference to FIG. 10.

The battery accessory 7 is fixed on the headset 3, to power the different modules of the other accessories 5 (GPS module), 10 (Transmission module), 9 (visual module/camera), and 6 (connection module with the external device).

The connection module 6 can be used to retransmit information from the breast plate 81 (for example allowing ballistic detection 82) and detection of information derived from other elements, for example providing information about the content of the pocket 83 of the jacket worn by the user.

The transmission modules 10, are used to dialogue with an external server 84 (command post), itself interacting with other devices 85 (drones, vehicles, etc.) that will be able to perform operations 86 (for example deliveries of missing parts) to locations detected and positioned by the GPS modules 5.

We will now describe operation of the device with reference to FIGS. 1, 8, 9 and 10.

A user who decides to use the device according to the embodiment of the invention described more particularly herein will fit the support/hood on their headset.

They will then connect the accessories that they have decided to use to the different locations of the first magnetic elements.

Not all locations (in this case eight locations) are necessarily used.

Placement takes place naturally, the connection direction necessarily being found by the user, the polarities naturally acting as a foolproof system.

A mechanical click fit/release system can also secure the position, but the strength of the magnets is sufficient to prevent the loss of an accessory.

All accessories are then connected by wire and will then be able to interact with each other depending on the required functioning, that will depend on the required application in a manner known in itself.

When the user would like to disconnect, replace or change the position of an accessory, all they have to do is to push the accessory laterally on its head, the differences in polarities of the magnets, once offset slightly, will almost automatically eject the accessory due to magnetic repulsion.

In the case of using a connected charger pocket (83), this informs the staff that such or such soldier no longer has ammunition. It is thus decided, automatically or not (server 84) to send a drone which will bring the soldier ammunition, or a medical kit, or food for survival, for example. It is the function of the pocket which comprises a sensor (empty/full) which will transmit information via the module situated on the headset which in this case, is important.

FIG. 11 is a lateral view of a hood 90 made of stretch fabric formed from three patterns 91, 92 and 93 (see FIG. 12A to 12C) stitched to one another on their opposing lateral side edges 94, in a manner known in itself.

The hood is, for example, removably attached on the headset, for example by clips.

This dismountable character enables its replacement and/or its cleaning, easily.

The hood comprises eleven electrical connector locations 95 with modules, each comprising orifices 96 for the passage of electrical contacts sealed through conductive glue stoppers of the type described above.

The internal electrical connector system or circuit network between the first magnetic elements 97 of the type described for example in reference to FIG. 6 has been represented in FIGS. 12A to 12C, the four central orifices 98 corresponding to one same ground wire 99.

In the embodiment described in this case, the other orifices 96 correspond to different red, black, green and white inputs/outputs of a USB type plug, as represented in FIG. 3A (and of which the electrical connector wires 100 to 105 connected to one another are, for example, made by screen printing with a graphite paste such as described above.

FIG. 13 shows an example of an embodiment of the electrical connector by screen printing obtained with a stencil, corresponding to the central pattern 91 (reversed) such as traced (line 106) on the material 107.

Each wire (which can also be formed by Scotch® Cooper) of a pattern 91, 92, 93 is connected to the corresponding wires of the pattern nearby by way of a wider strip 108 (for the wires 100), 109 (for the wires 101), 110 (for the wires 102), 111 (for the wires 103) and 112 (for the wires 105).

The end of each of these strips of a pattern comes opposite the end of each strip of the other pattern, the sealed electrical connector being ensured during the cutting of edges of peripheral parts 94 of one pattern on the other.

In FIGS. 14 and 15, two embodiments of the external contact part of a first magnetic element through an orifice 96 have been represented, the hood 90 in FIG. 11 showing the conduction through the fabric.

More precisely, FIGS. 14 and 15 show a magnet 113 of the type described above.

After piercing the fabric 114 through the orifice 96, for example of diameter of 1 to 2 mm, this is deposited on an assembly formed by a sanded, adhesive, copper film 115 (or screen-printed conductive paste lines as described above) belonging to the network such as described in reference to FIGS. 12A to 12C, for example, that is glued onto the magnet 113, by means of a glue tip 116.

A conductive glue drop 117 is thus deposited in the orifice 96 that it blocks so it is sealed, opposite the magnet.

It all is then and for example covered with a Teflon or resin sheet (dot-dash line 118) to obtain a smooth and elastic surface. Then, the Teflon is removed by sanding at the level of the orifices 96 to achieve a conduction with the outer face of the glue drop, which will be in contact with the module.

FIG. 15 shows the case where the screen-printed alloy wire or the Scotch® Copper is situated on the other side of the magnet with respect to the fabric, opposite to FIG. 14.

In this case, the electrical connector between the conductive glue drop 117 and the screen-printed alloy wire or adhesive, copper strip (Scotch® Copper) must avoid the magnet 113, for example by means of a U-shaped sheet 118, for example made of Scotch® Copper, a magnetic insulating plate 119 of the magnet with respect to the head of the user of the hood being, for example, also provided.

Obviously, and also consequent to all the above, this invention is not limited to the embodiments specifically described. On the contrary, it includes all variants and particularly variants in which the support is different, for example possibly a jacket, a vest or a belt.

One of the advantages of this invention is that the positions of different accessories can be swapped, and it is easy to replace them in the case of damage or wear.

With the invention, it is also possible to use a fixed or removable pocket in a jacket, for example connected to the headset and that signals if it is empty or full.

Advantageously, the accessories will be able to receive Braille type signals (touch) so know if it is a telephone or a camera.

Also advantageously, the battery comprises two second magnetic elements arranged to cooperate with two first magnetic elements to give an even more secure attachment on the headset, for mechanical reasons related to its weight and its position.

Advantageously, the articulated magnetic strips are crossed in order to split into two, the number of lines/circuits, which also enables and particularly to be able to return the modules to 180°, which for example, enables their placement by the user without being concerned about the delivery direction of the module.

The invention claimed is:

1. Device comprising:
   a support for electronic connection, holding in contact, and attachment of at least two accessories to be connected to each other and/or to an external device via said support,
   the support comprising at least two first magnetic electronic connection elements connected to each other by wire,
   and said at least two accessories, each accessory being respectively fitted with a second magnetic electronic connection element capable of cooperating with one of said first magnetic electronic connection elements,
   and each accessory comprising a housing containing said respective second magnetic connection element arranged to correspond to one of said first magnetic electronic connection elements facing it, to be gripped manually by a user for attachment or disconnection of the accessory from said support,
   and wherein each of said first and second magnetic electronic elements comprises at least two groups of magnet(s), each group comprising at least one magnet, namely a group of one or more positive magnets and a group of one or more negative magnets, the groups of any of said first and second magnetic connection elements being respectively fixed directly or indirectly either on a same flexible or rigid plate and/or to each other and being capable of cooperating with a corresponding one of said second or first magnetic electronic connection element.

2. Device according to claim 1, wherein each accessory comprises a circuit and/or an electronic device, having one or more specific functionalities.

3. Device according to claim 2, wherein at least one part of the first magnetic electronic connection elements and/or at least one part of the second magnetic electronic connection elements comprises on the side of its attachment to the support and/or on the side of the electronic component of the accessory to be connected, a magnetic insulating screen forming an anti-magnetic protective element.

4. Device according to claim 3, wherein the anti-magnetic protection is metallic and is 0.1 mm to 2 mm thick.

5. The device according to claim 3, wherein the anti-magnetic protection is a plate made of several layers of steel foil added together to make the thickness necessary to reflect the magnetic field onto the opposite face therefore providing a magnetic mirror effect.

6. The device according to claim 5, wherein the anti-magnetic protection having mirror effect is longer and wider than the group of magnets.

7. Device according to claim 1, wherein it is arranged to be part of a headset, and wherein each of said first or second electronic connection element having a magnetic field, said magnetic field is greater than 2000 Gauss.

8. Device according to claim 1, wherein the magnets of groups of said first magnetic electronic connection elements being capable of cooperating with the magnets of groups of said corresponding second magnetic electronic connection elements with the opposite sign, each first and second magnetic element comprises at least two magnets per group, the positive magnets of an element being disposed alternately with the negative magnets of the same element.

9. Device according to claim 1, wherein the magnets of one same first or second magnetic electronic connection element are rigidly and non-removably fixed and are electrically insulated from each other, on a plate.

10. Device according to claim 1, wherein one or more magnets in each first and second magnetic element has (have) a rectangular or circular cross-section and in that the magnets are derived from the family of rare earths of the neodymium iron boron type.

11. Device according to claim 1, wherein the wire connection between magnets and/or first magnetic electronic connection elements is integrated between two fabric sheets one of which forms the support.

12. Device according to claim 1, wherein the wire connection and the support are free to stretch.

13. Device according to claim 1, wherein the wire connection is formed at least in part by an adhesive, conductive copper, aluminum or any other metal tape and/or at least in part, by a conductive alloy or by a combination of both.

14. Device according to claim 1, wherein at least one accessory housing comprises complementary mechanical click/fit release system arranged to further secure said housing on a complementary shaped part fixed to the first magnetic element.

15. Headset comprising a device according to claim 1.

16. Clothing comprising a device according to claim 1.

17. Assembly comprising a headset according to claim 15, wherein the assembly comprises: a. said headset, one or more clothes, a rucksack, and one or more connected pockets; b. said accessories comprising one or more electrical circuits or devices having one or more specific functionalities, and a battery; c. a hood slidable on the headset, formed from a pattern cut-out in three parts only, without clamps and comprising said first magnetic electronic connection elements and their wire connection.

18. Assembly according to claim 17, wherein the at least one device comprises a jacket equipped with a fabric comprising a sheet of connected wires, forming a matrix for detecting a damaged zone.

19. Assembly comprising a headset according to claim 15 or clothing according to claim 16, wherein the assembly comprises at least one device worn by a user and a wire connection through an accessory between said headset or clothing and the at least one device worn by the user.

* * * * *